(12) United States Patent
Abe et al.

(10) Patent No.: US 8,714,084 B2
(45) Date of Patent: May 6, 2014

(54) SCREEN PRINTING APPARATUS AND SCREEN PRINTING METHOD

(75) Inventors: Seiko Abe, Yamanashi (JP); Tetsuya Tanaka, Yamanashi (JP)

(73) Assignee: Panasonic Corporation, Osaka (JP)

( * ) Notice: Subject to any disclaimer, the term of this patent is extended or adjusted under 35 U.S.C. 154(b) by 470 days.

(21) Appl. No.: 13/141,817

(22) PCT Filed: Apr. 14, 2010

(86) PCT No.: PCT/JP2010/002690
§ 371 (c)(1),
(2), (4) Date: Jun. 23, 2011

(87) PCT Pub. No.: WO2010/122736
PCT Pub. Date: Oct. 28, 2010

(65) Prior Publication Data
US 2011/0259217 A1    Oct. 27, 2011

(30) Foreign Application Priority Data

Apr. 24, 2009    (JP) ................. 2009-105980

(51) Int. Cl.
B05C 17/04         (2006.01)
B41F 5/16          (2006.01)

(52) U.S. Cl.
USPC ............ 101/123; 101/126; 101/127; 101/129

(58) Field of Classification Search
CPC ........... B41N 1/24; B41F 15/00; B41F 15/18; B41F 15/26; B41F 15/36; B41F 15/42; B41F 15/423; B41F 15/0813; B41F 15/818; B41F 15/085; B41F 15/0859; B05C 17/08; H05K 1/183; H05K 3/126; H05K 3/1233
USPC .......................... 101/114, 123, 126, 127, 129
See application file for complete search history.

(56) References Cited

U.S. PATENT DOCUMENTS 6,202,551 B1    3/2001  Murakami
8,499,688 B2 *  8/2013  Miyahara et al. ............. 101/123

(Continued)

FOREIGN PATENT DOCUMENTS

CN    1829605 A     9/2006
CN    1853928 A     11/2006

(Continued)

OTHER PUBLICATIONS

International Search Report for PCT/JP2010/002690 dated May 18, 2010.

(Continued)

Primary Examiner — Ren Yan
Assistant Examiner — Marissa Ferguson Samreth
(74) Attorney, Agent, or Firm — Pearne & Gordon LLp

(57) ABSTRACT

The present invention provides a screen printing apparatus and screen printing method which, in screen printing that is to be performed on the upper surface of a circuit board, and the bottom surfaces of recess openings in the upper surface, can efficiently perform a printing work while ensuring an excellent printing quality. In a screen printing apparatus which prints a paste for bonding an electronic component on an upper surface and a bottom-surface of a recess, a printing apparatus 2(1) and a printing apparatus 2(2) which sequentially 10 print the paste in two steps on the circuit board are placed in series. The printing apparatus 2(1) on the upstream side includes a bottom-surface printing mask which is provided in correspondence with the bottom surface of the recess, and a closed squeegee mechanism 36A which butts against and slides over an upper surface of the bottom-surface printing mask to 15 pressurize and supply the paste. The printing apparatus 2(2) on the downstream side includes an upper-surface printing mask which is provided in correspondence with the upper surface and an opened squeegee mechanism 36B which butts against and slides over an upper surface of the upper-surface printing mask to fill the paste into pattern holes.

6 Claims, 10 Drawing Sheets

(56) References Cited

U.S. PATENT DOCUMENTS

| | | | |
|---|---|---|---|
| 2002/0007789 A1* | 1/2002 | Doyle et al. | 118/704 |
| 2005/0022733 A1 | 2/2005 | Miyahara et al. | |
| 2006/0243144 A1 | 11/2006 | Murakami | |
| 2007/0057027 A1 | 3/2007 | Bourrieres et al. | |
| 2010/0242755 A1 | 9/2010 | Nagao | |
| 2012/0009484 A1* | 1/2012 | Aburatani et al. | 429/322 |
| 2012/0304876 A1* | 12/2012 | Miyake et al. | 101/114 |
| 2012/0304877 A1* | 12/2012 | Yamada et al. | 101/126 |

FOREIGN PATENT DOCUMENTS

| | | |
|---|---|---|
| CN | 1857041 A | 11/2006 |
| JP | 61-164895 A | 7/1986 |
| JP | 01-270390 A | 10/1989 |
| JP | 5-13740 U | 2/1993 |
| JP | 5-57870 A | 3/1993 |
| JP | 2000-168040 A | 6/2000 |
| JP | 2008-235761 A | 10/2008 |
| JP | 2009-070867 A | 4/2009 |
| WO | 2009/035136 A1 | 3/2009 |

OTHER PUBLICATIONS

Chinese Office Action for Application No. 201080005545.1 dated Mar. 21, 2013.

* cited by examiner

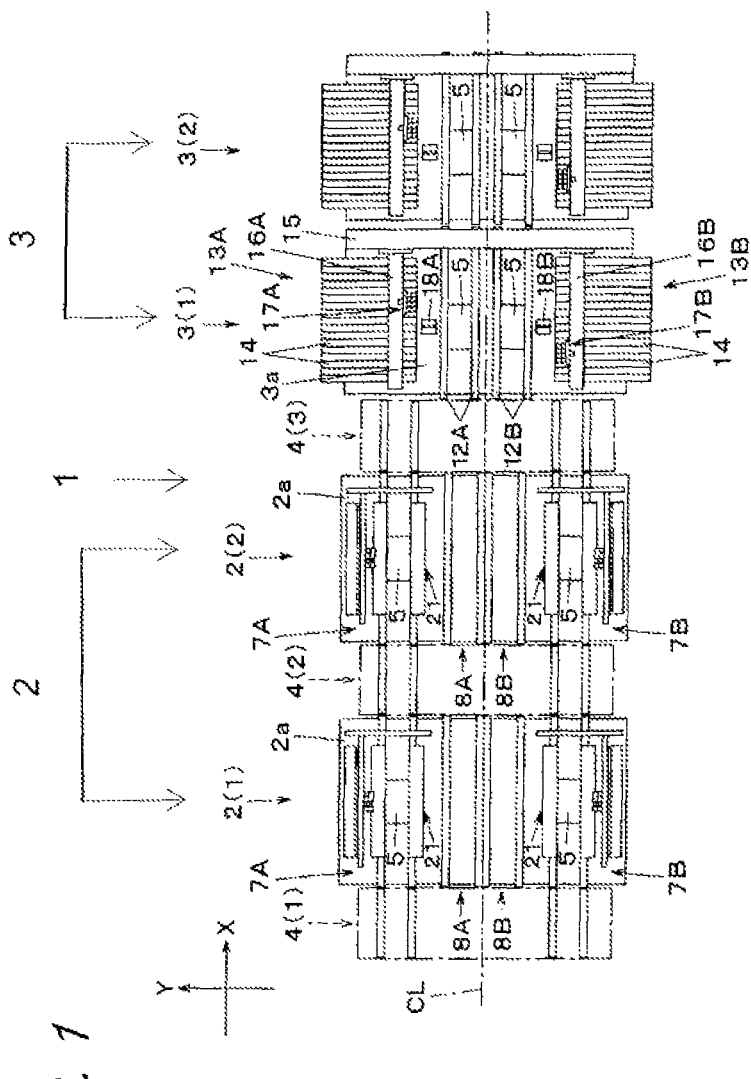

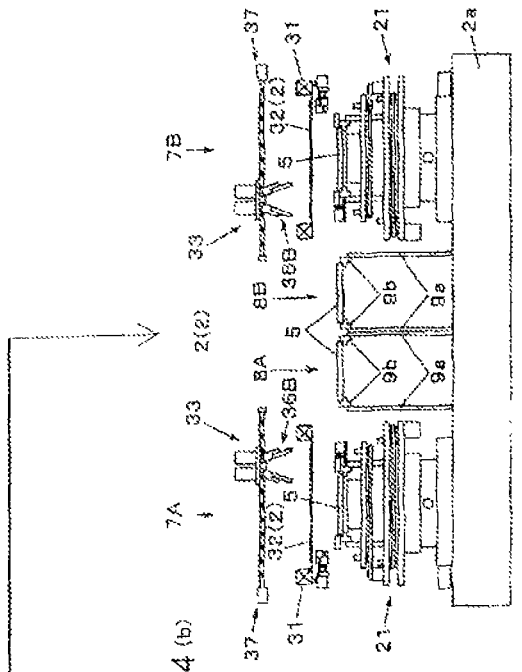
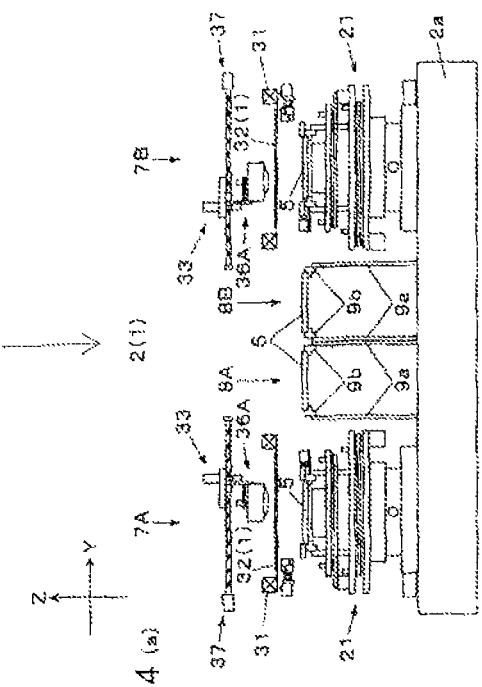

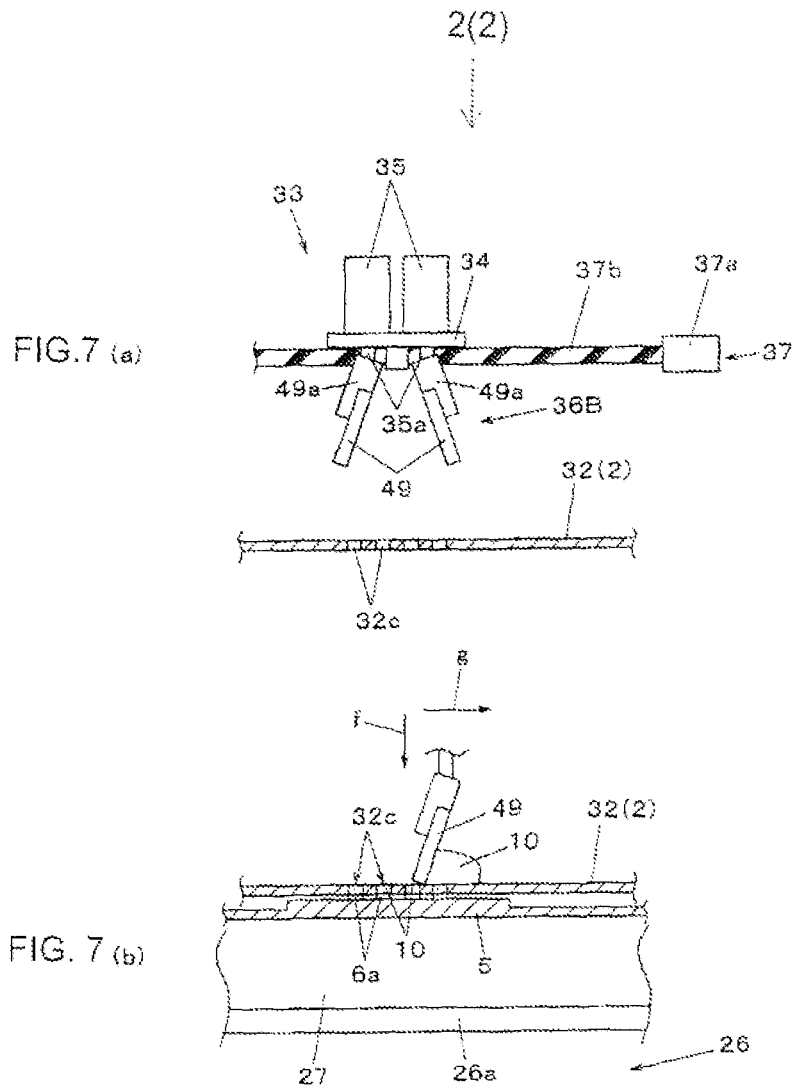

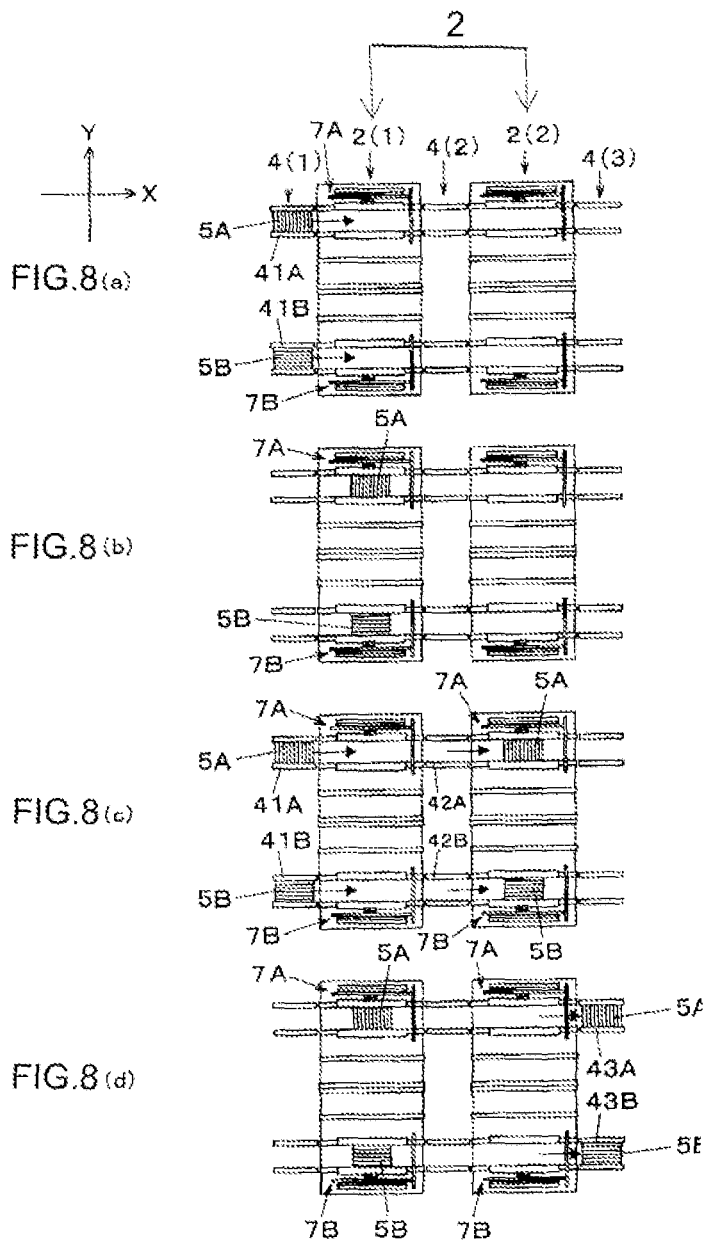

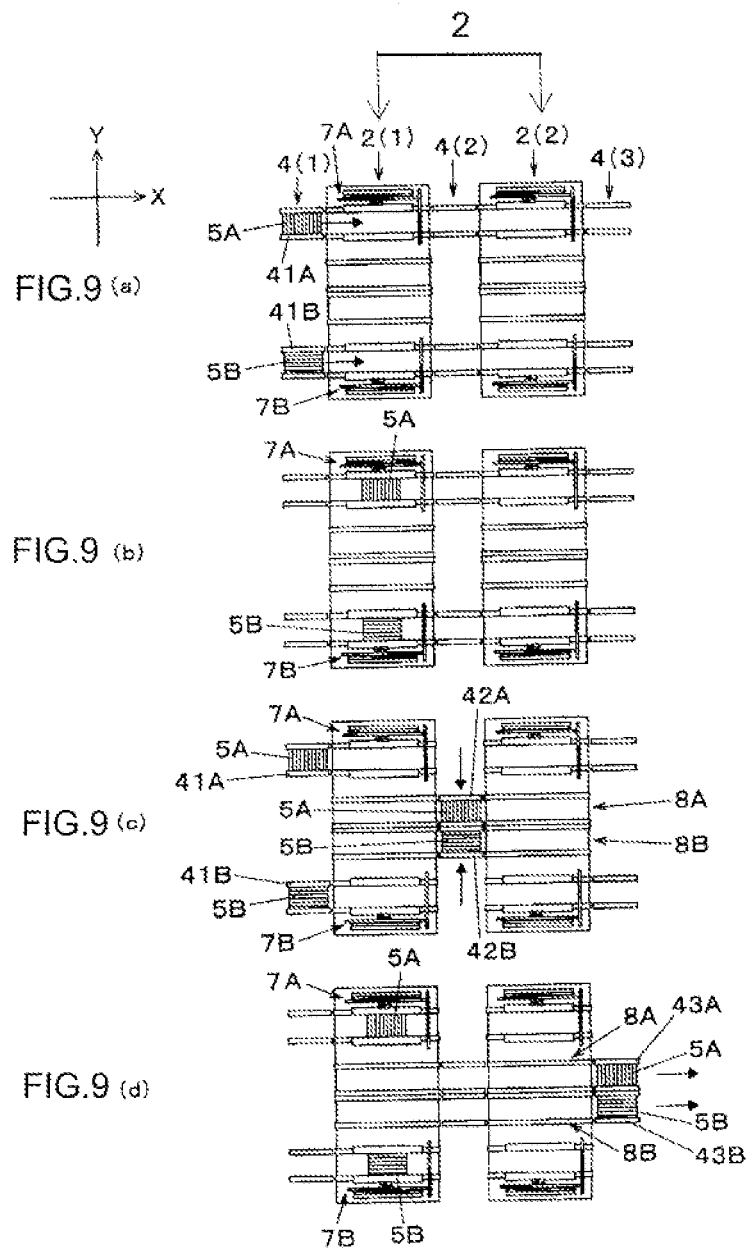

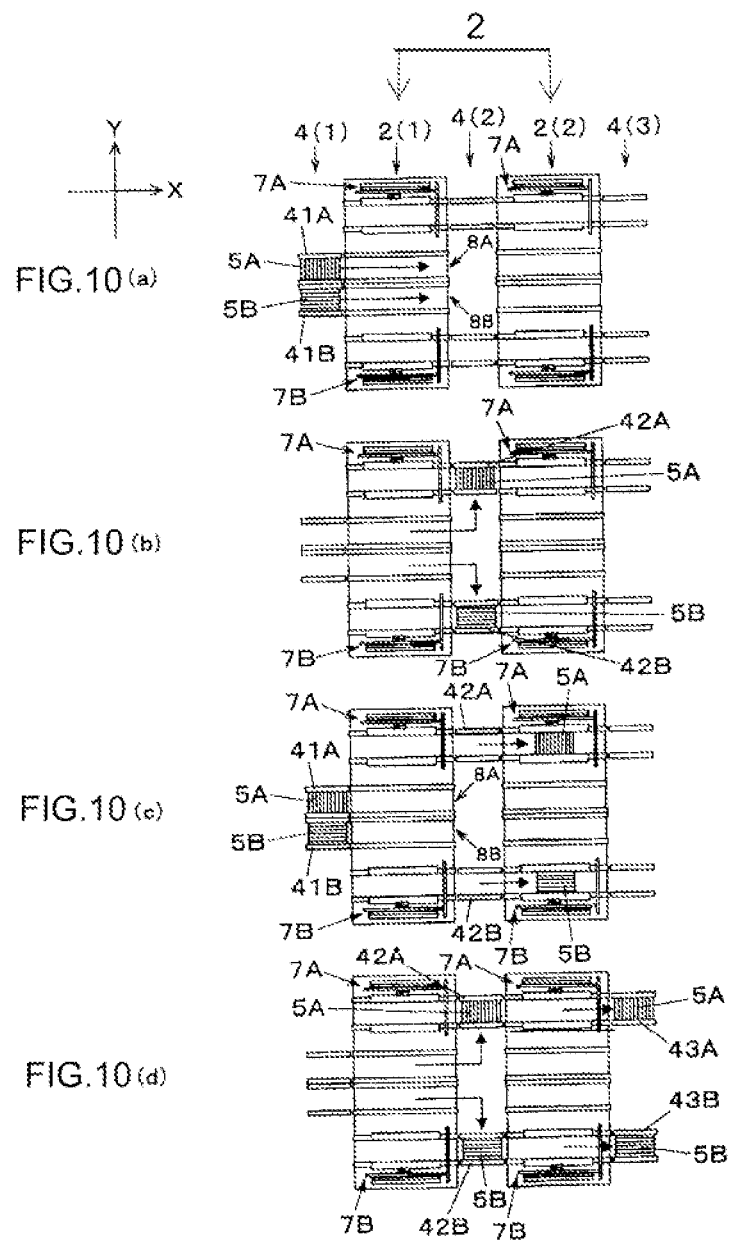

SCREEN PRINTING APPARATUS AND SCREEN PRINTING METHOD

TECHNICAL FIELD

The present invention relates to a screen printing apparatus and screen printing method which print a paste for bonding an electronic component on the upper surface of a circuit board, and the bottom surfaces of recesses opening in the upper surface.

BACKGROUND ART

An electronic component mounting line for producing a mounting circuit board in which electronic components are mounted on a circuit board is configured by connecting a screen printing apparatus for printing a paste for bonding an electronic component such as a semiconductor device on the circuit board, to the upstream side of an electronic component mounting apparatus which mounts the electronic component onto the circuit board. As a type of a circuit board on which electronic components are to be mounted, conventionally, a so-called cavity circuit board is known in which an electrode pattern is formed on both the upper surface of the circuit board, and the bottom surfaces of recesses opening in the upper surface of the circuit board, and such a circuit board is used in various apparatuses as a lightweight and high-density circuit board (Patent Reference 1). In screen printing which prints a paste for bonding an electronic component on such a cavity circuit board, a three-dimensional screen mask is used which has a planar portion that is to be contacted with the upper surface of a circuit board, and fitting portions that are downward projected from the planar portion to be fitted to recesses. When such a three-dimensional screen mask is used, a paste can be printed simultaneously on the upper surface of the circuit board, and the bottom surfaces of the recesses.

PRIOR ART REFERENCE

Patent Reference

Patent Reference 1: JP-A-2008-235761

SUMMARY OF THE INVENTION

Problems that the Invention is to Solve

In screen printing which is to be applied on the above-described cavity circuit board, however, there are various limitations and problems due to the use of a three-dimensional screen mask, and hence a printing work is hardly performed in an efficient manner while ensuring an excellent printing quality. In order to print a paste on a circuit board without causing bleeding and lack, for example, the paste must be adequately filled into pattern holes disposed in the screen mask. However, the conditions for filling pattern holes disposed in a planar portion with a paste are inherently different from those for filling a paste into pattern holes disposed in fitting portions. In the same screen printing mechanism, therefore, an excellent printing quality is hardly ensured in both a planar planer portion and fitting portions.

In a process of repeatedly performing screen printing, mask cleaning in which printing residue adhering the lower surface of the screen mask is removed must be performed at predetermined intervals. Therefore, a screen printing apparatus includes a mask cleaning mechanism which causes a cleaning sheet to be sliding contacted with the lower surface of the screen mask to wipe off printing residue. In the case where a three-dimensional screen mask is used, however, the cleaning sheet cannot be adequately sliding contacted with the portion to be cleaned, because the planar portion and fitting portions on which cleaning is performed are not in the same plane, and hence it is difficult to perform satisfactory mask cleaning. Therefore, it has been requested to develop a countermeasure for efficiently performing a printing work on a cavity circuit board while ensuring an excellent printing quality.

Therefore, it is an object of the invention to provide a screen printing apparatus and screen printing method which, in screen printing that is to be performed on the upper surface of a circuit board, and the bottom surfaces of recess openings in the upper surface, can efficiently perform a printing work while ensuring an excellent printing quality.

Mode for Carrying Out the Invention

The screen printing apparatus of the invention is a screen printing apparatus which is to be connected to an upstream side of an electronic component mounting apparatus for mounting an electronic component onto a circuit board, to constitute an electronic component mounting line, and which prints a paste for bonding an electronic component on upper-surface printing areas which are set on an upper face of the circuit board, and in which upper-surface electrodes are formed, and bottom-surface printing areas which are set on bottom surfaces of recesses opening in the upper surface, and in which bottom-surface electrodes are formed, wherein the screen printing apparatus has: an upstream screen printing portion and downstream screen printing portion which are placed in series along a circuit board transporting direction in the electronic component mounting line, and which sequentially print the paste in two steps on the circuit board; and a circuit board transferring portion which transfers the circuit board from the upstream screen printing portion to the downstream screen printing portion, the upstream screen printing portion includes: a bottom-surface printing mask having fitting portions which are disposed in correspondence with the bottom-surface printing areas, and which are to be fitted into the recesses, and pattern holes which are formed in the fitting portions in correspondence with the bottom-surface electrodes; and a closed squeegee mechanism which butts against and slides over an upper surface of the bottom-surface printing mask to pressurize the paste that is retained inside, to supply the paste into the fitting portions, and the downstream screen printing portion includes: an upper-surface printing mask having pattern holes which are disposed in correspondence with the upper-surface printing areas, and which are formed in correspondence with the upper-surface electrodes; and a squeegee which butts against and slides over an upper surface of the upper-surface printing mask to fill the paste into the pattern holes.

The screen printing method of the invention is a screen printing method in which, on upper-surface printing areas which are set on an upper face of a circuit board, and in which upper-surface electrodes are formed, and bottom-surface printing areas which are set on bottom surfaces of recesses opening in the upper surface, and in which bottom-surface electrodes are formed, a paste for bonding an electronic component is sequentially printed in two steps by an upstream screen printing portion and downstream screen printing portion which are placed in series along a circuit board transporting direction in an electronic component mounting line, wherein, in a bottom-surface printing step which is aimed to the bottom-surface printing areas, and which is performed by the upstream screen printing portion, the circuit board is positioned to a bottom-surface printing mask having fitting portions which are disposed in correspondence with the bottom-surface printing areas, and which are to be fitted into the recesses, and pattern holes which are formed in the fitting portions in correspondence with the bottom-surface electrodes, and a closed squeegee mechanism is caused to butt against and slide over an upper surface of the bottom-surface printing mask, whereby the paste that is retained inside the closed squeegee is pressurized and supplied into the fitting portions, and, in an upper-surface printing step which is aimed to the upper-surface printing areas, and which is performed by the downstream screen printing portion, the circuit board is positioned to an upper-surface printing mask having pattern holes which are disposed in correspondence with the upper-surface printing areas, and which are formed in correspondence with the upper-surface electrodes, a squeegee is caused to butt against and slide over an upper surface of the upper-surface printing mask, whereby the paste is filled into the pattern holes.

Effects of the Invention

According to the invention, in a screen printing apparatus which prints a paste for bonding an electronic component on upper-surface printing areas which are set on the upper face of a circuit board, and in which upper-surface electrodes are formed, and bottom-surface printing areas which are set on the bottom surfaces of recesses, and in which bottom-surface electrodes are formed, an upstream screen printing portion and downstream screen printing portion which sequentially print the paste in two steps on the circuit board are placed, the upstream screen printing portion includes: a bottom-surface printing mask which is disposed in correspondence with the bottom-surface printing areas; and a closed squeegee mechanism which butts against and slides over the upper surface of the bottom-surface printing mask to pressurize the paste to supply the paste, and the downstream screen printing portion includes: an upper-surface printing mask which is disposed in correspondence with the upper-surface printing areas; and a squeegee which butts against and slides over the upper surface of the upper-surface printing mask to fill the paste into the pattern holes. In screen printing that is to be performed on the upper surface of a circuit board, and the bottom surfaces of recesses opening in the upper surface, therefore, a printing work can be efficiently performed while ensuring an excellent printing quality.

BRIEF DESCRIPTION OF THE DRAWINGS

FIG. 1 is a plan view showing the configuration of an electronic component mounting line in an embodiment of the invention.

FIGS. 4(a) and 4(b) are sectional views of the screen printing apparatus of the embodiment of the invention.

FIGS. 7(a) and 7(b) are diagrams of the structure and function of an opened squeegee mechanism which is used in the screen printing apparatus of the embodiment of the invention.

FIGS. 8(a), 8(b), 8(c), and 8(d) are operation diagrams of printing and circuit board transporting operations in the screen printing apparatus of the embodiment of the invention.

FIGS. 9(a), 9(b), 9(c), and 9(d) are operation diagrams of the printing and circuit board transporting operations in the screen printing apparatus of the embodiment of the invention.

FIGS. 10(a), 10(b), 10(c), and 10(d) are operation diagrams of the printing and circuit board transporting operations in the screen printing apparatus of the embodiment of the invention.

MODE FOR CARRYING OUT THE INVENTION

First, referring to FIG. 1, the configuration of an electronic component mounting line 1 will be described. The electronic component mounting line 1 has a function of mounting electronic components on a circuit board 5 to produce a mounting circuit board, and is configured so that a screen printing apparatus 2 (hereinafter, referred to simply as "printing apparatus 2") for printing a paste for bonding an electronic component on the circuit board 5 is connected to the upstream side (the left side in FIG. 1) of an electronic component mounting apparatus 3 (hereinafter, referred to simply as "mounting apparatus 3") for mounting an electronic component onto the circuit board 5. In the description, suffixes (1), (2) . . . which are added to apparatuses such as the printing apparatus 2 and the mounting apparatus 3 mean the arrangement sequence of the correspondence apparatus in the electronic component mounting line 1, respectively.

The electronic component mounting line 1 has a configuration where two mounting apparatuses 3(1), 3(2) which are placed in series are connected to the downstream side of two printing apparatuses 2(1), 2(2) which are placed in series. A circuit board distributing apparatus 4(1) and a circuit board distributing apparatus 4(2) are additionally disposed in the upstream and downstream sides of the printing apparatus 2(1), respectively. Moreover, a circuit board distributing apparatus 4(3) is additionally disposed in the downstream side of the printing apparatus 2(2). The circuit board 5 which is transported from an upstream apparatus in the circuit board transportation direction (X-direction) is sent into the printing apparatus 2(1) through the circuit board distributing apparatus 4(1), and the circuit board 5 which has been subjected to screen printing by the printing apparatus 2(1) is delivered to the printing apparatus 2(2) through the circuit board distributing apparatus 4(2), and the circuit board 5 which has been further subjected to screen printing by the printing apparatus 2(2) is delivered to the mounting apparatus 3(1) through the circuit board distributing apparatus 4(3).

Figure 2A:
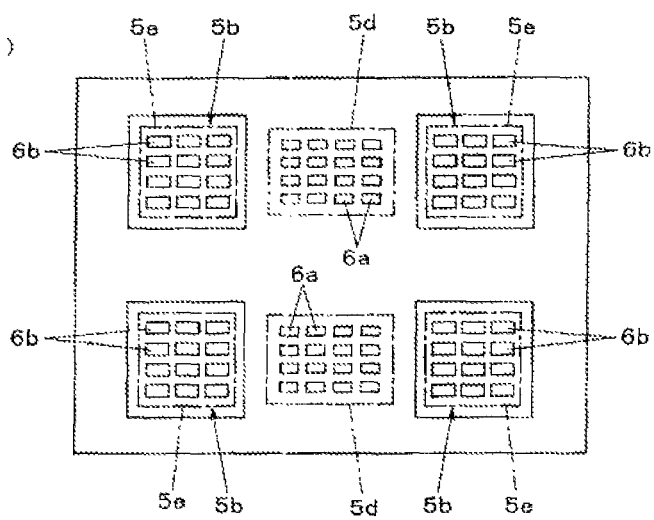
FIGS. 2(a) and 2(b) are diagrams of a circuit board on which mounting is to be performed by the electronic component mounting line in the embodiment of the invention.
Figure 2B:
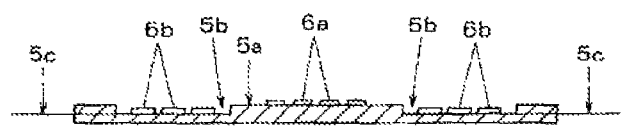

The circuit board 5 on which a mounting work by the electronic component mounting line 1 in the embodiment is to be performed will be described with reference to FIG. 2. Here, the circuit board 5 has a form having two kinds of printing surfaces having different heights. As shown in FIG. 2, namely, a plurality (here, two) of upper-surface printing areas 5d in which a plurality of upper-surface electrodes 6a are formed are set on the upper surfaces 5a in a middle portion of the circuit board 5. In the vicinity of each of corner portions of the circuit board 5, furthermore, a recess 5b having a bottom surface 5c which is lower in level than the upper surface 5a, and a plurality of bottom-surface electrodes 6b are formed in a bottom-surface printing area 5e which is set on the bottom surface 5c. The printing apparatus 2(1) prints cream solder which is a paste for bonding an electronic component, on the bottom-surface printing areas 5e in the recesses 5b, and the printing apparatus 2(2) prints the cream solder on upper-surface printing areas 5d which are set on the upper face 5a.

In the embodiment, namely, the printing apparatus 2(1) and the printing apparatus 2(2) are placed in series along the circuit board transporting direction (X-direction) in the electronic component mounting line 1, and constitute an upstream screen printing portion and downstream screen printing portion which sequentially print the cream solder in two steps on the circuit board 5, respectively. Then, the circuit board distributing apparatus 4(2) which is placed between the printing apparatus 2(1) and the printing apparatus 2(2) is formed as a circuit board transferring portion which transfers the circuit board 5 from the printing apparatus 2(1) that is the upstream screen printing portion, to the printing apparatus 2(2) that is the downstream screen printing portion. Each of the printing apparatus 2(1) and the printing apparatus 2(2) is configured by placing a first screen printing portion 7A and second screen printing portion 7B that have a function of printing the cream solder on the circuit board 5 on which a mounting work is to be performed, on a common platform 2a in a symmetrical manner in a plan view about the line center line CL of the electronic component mounting line 1. Two circuit board transporting portions 8A, 8B which transport forwardly and reversely the circuit board 5 in the circuit board transportation direction (X-direction) are disposed midway between the first screen printing portion 7A and the second screen printing portion 7B.

Next, the configuration of the mounting apparatus 3 will be described. The mounting apparatus 3(1) and the mounting apparatus 3(2) are configured in the same manner. Here, only the mounting apparatus 3(1) will be described while its components are denoted by reference numerals. Two pairs of circuit board transporting mechanisms 12A, 12B are disposed in parallel in the circuit board transportation direction (X-direction) in the middle of a platform 3a. The circuit board transporting mechanisms 12A, 12B transport the circuit board 5 which is delivered from the printing apparatus 2(2) through the circuit board distributing apparatus 4(3), and position the circuit board to a mounting stage in which a component mounting work is to be performed by a component mounting mechanism that will be described below.

Part supplying portions 13A, 13B are disposed outside the circuit board transporting mechanisms 12A, 12B, respectively. A plurality of tape feeders 14 are juxtaposed with one another in the component supplying portions 13A, 13B. The tape feeders 14 pitch-feed carrier tapes holding electronic components which are to be mounted on the circuit board 5, thereby supplying the electronic components to component pickup positions of the component mounting mechanism. A Y-axis moving table 15 is disposed in an end portion of the platform 3a on the side of the X-direction, and mounting heads 17A, 17B are attached to two X-axis moving tables 16A, 16B which are coupled to the Y-axis moving table 15. The mounting heads 17A, 17B include a plurality of unit mounting heads, and suction nozzles attached to the unit mounting heads hold electronic components by means of vacuum suction.

When the Y-axis moving table 15 and the X-axis moving tables 16A, 16B are driven, the mounting heads 17A, 17B are horizontally moved in the X-direction and the Y-direction. Therefore, the mounting heads 17A, 17B take out electronic components by means of suction from the tape feeders 14 of the component supplying portions 13A, 13B, and transfer and mount onto the circuit boards 5 which are positioned to the mounting stages of the circuit board transporting mechanisms 12A, 12B. Component recognition cameras 18A, 18B are disposed in moving paths of the mounting heads 17A, 17B. When the mounting heads 17A, 17B holding electronic components are moved above the component recognition cameras 18A, 18B take images of the electronic components held by the mounting heads 17A, 17B from the lower side, and recognize the electronic components.

Figure 5:
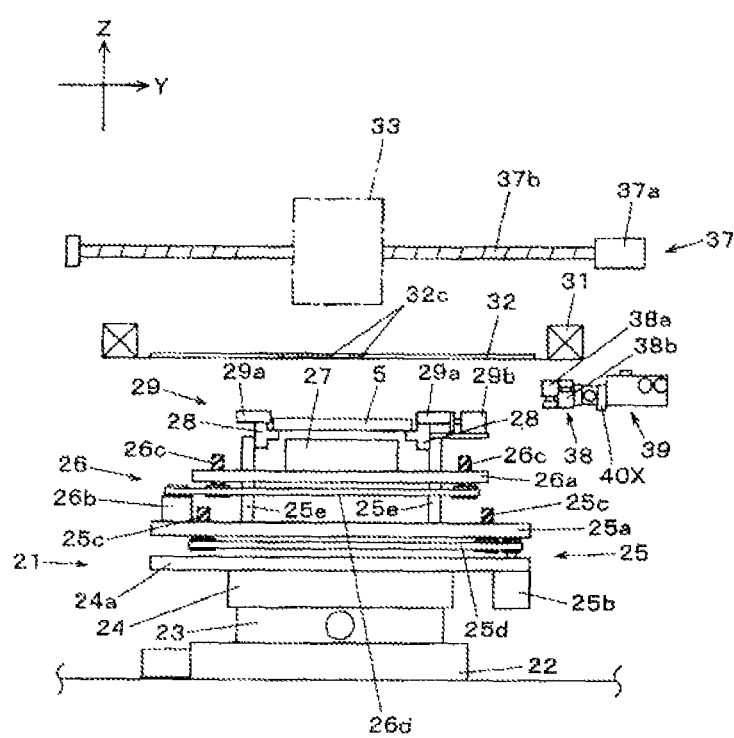
FIG. 5 is a sectional view of a screen printing portion in the screen printing apparatus of the embodiment of the invention.

Next, the structures of the printing apparatus 2(1) and the printing apparatus 2(2) will be described with reference to FIGS. 3, 4, and 5. FIGS. 4(a) and 4(b) show views looking in the directions of arrows A-A and B-B in FIG. 3, i.e., sections of the printing apparatus 2(1) and the printing apparatus 2(2), respectively. FIG. 5 is a detailed sectional view illustrating the structures of the first screen printing portion 7A and the second screen printing portion 7B.

Figure 3:
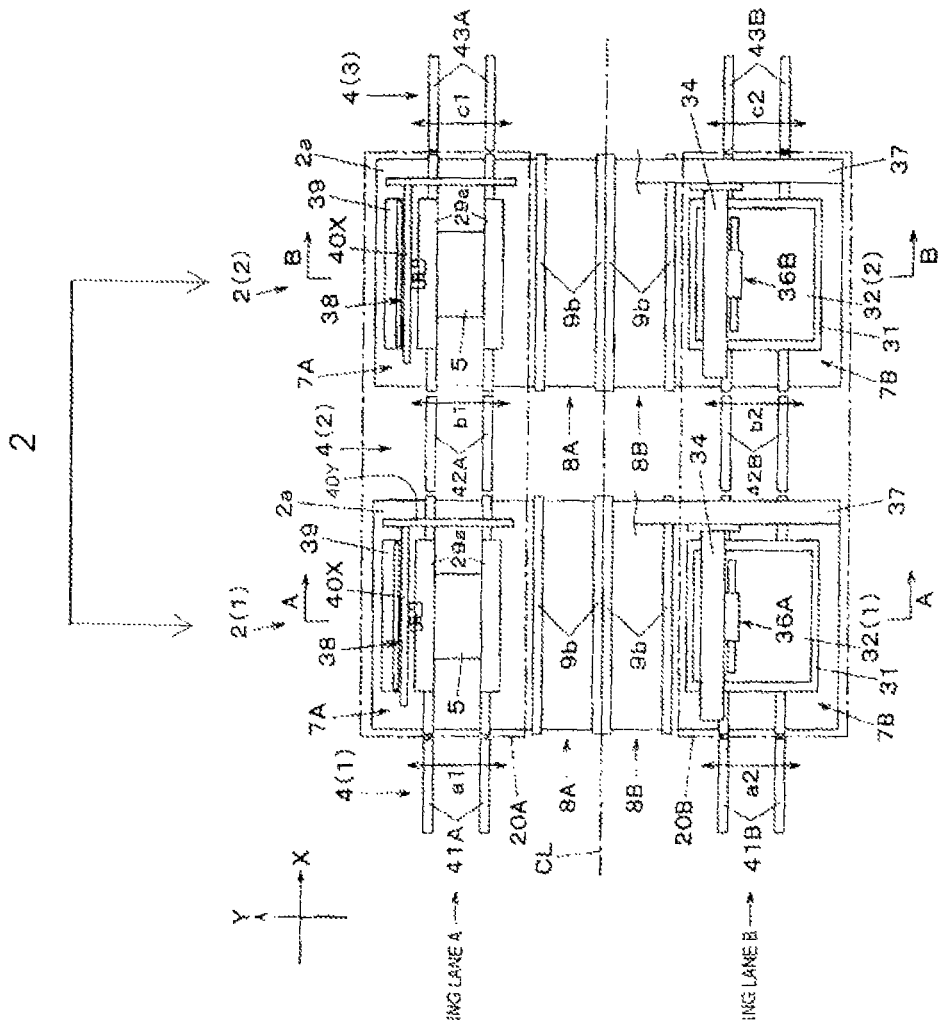
FIG. 3 is a plan view of a screen printing apparatus of the embodiment of the invention.

As shown in FIGS. 3 and 4, on the upper surface of the platform 2a, the circuit board transporting portions 8A, 8B are disposed midway between the first screen printing portion 7A and the second screen printing portion 7B, in the X-direction along the center line CL. The circuit board transporting portions 8A, 8B have a configuration where a circuit board transporting mechanism 9b including a conveyor mechanism for transporting a circuit board is held by an upper end portion of a frame 9a which upstands from the platform 2a, and can transport the circuit boards 5 in both the forward and reverse directions by the circuit board transporting mechanisms 9b.

When the conveyor mechanisms of the circuit board transporting mechanisms 9b are downwardly driven, namely, the circuit boards 5 which are supplied from an upstream apparatus can be passed to a downstream apparatus while bypassing the first screen printing portion 7A and second screen printing portion 7B of the corresponding printing apparatus 2. In this case, the circuit board transporting portions 8A, 8B function as bypass transporting paths which allow the circuit boards 5 that are to be sent to the downstream apparatus, to pass through. When the conveyor mechanisms of the circuit board transporting mechanisms 9b are upwardly driven, the circuit boards 5 can be transported from the downstream apparatus to the upstream side of the corresponding printing apparatus 2. In this case, the circuit board transporting portions 8A, 8B function as return transporting paths which return the circuit boards 5 that have been once sent to the downstream apparatus, to the upstream side.

The circuit board distributing apparatus 4(1) which is additionally disposed in each of the upstream and downstream sides of the printing apparatus 2 includes distributing conveyors 41A, 41B each including a conveyor mechanism for transporting a circuit board. Similarly, the circuit board distributing apparatus 4(2) and the circuit board distributing apparatus 4(3) include distributing conveyors 42A, 42B and distributing conveyors 43A, 43B. The distributing conveyors 41A, 41B, distributing conveyors 42A, 42B, and distributing conveyors 43A, 43B are individually movable in the Y-direction by transportation rail moving mechanisms (not shown), respectively (see arrows a1, a2, b1, b2, c1, and c2).

In the circuit board distributing apparatus 4(1), the movement in the Y-direction of the distributing conveyors can cause the distributing conveyors 41A, 41B which, in a usual state, are connected respectively to circuit board transporting mechanisms 28 (see FIG. 5) of the first screen printing portion 7A and second screen printing portion 7B of the corresponding printing apparatus 2(1), to be connected as required to the circuit board transporting mechanisms 9b of the circuit board transporting portion 8A or the circuit board transporting portion 8B, and further to the circuit board transporting mechanism 28 of the other screen printing portion which is paired in the same printing apparatus 2. In the circuit board distributing apparatus 4(2), the distributing conveyors 42A, 42B which, in a usual state, are connected respectively to circuit board transporting mechanisms 28 of the first screen printing portion 7A and second screen printing portion 7B of the printing apparatus 2(2) can be connected as required to the circuit board transporting mechanisms 9b of the circuit board transporting portion 8A or the circuit board transporting portion 8B, and further to the circuit board transporting mechanism 28 of the other screen printing portion which is paired in the same printing apparatus 2.

Therefore, the circuit boards 5 which are delivered from the upstream apparatus to the circuit board distributing apparatus 4(1) can be delivered to the first screen printing portion 7A and second screen printing portion 7B of the printing apparatus 2(1) to be subjected to screen printing, or alternatively the circuit boards 5 can be delivered to the circuit board distributing apparatus 4(2) by the circuit board transporting portion 8A or the circuit board transporting portion 8B in a form in which the first screen printing portion 7A and the second screen printing portion 7B are bypassed. Similarly, the circuit boards 5 which are delivered to the circuit board distributing apparatus 4(2) can be delivered to the first screen printing portion 7A and second screen printing portion 7B of the printing apparatus 2(2) to be subjected to screen printing, or alternatively the circuit boards 5 can be delivered to the mounting apparatus 3(1) which is the downstream apparatus through the circuit board distributing apparatus 4(3) by the circuit board transporting portion 8A or the circuit board transporting portion 8B in a form in which the first screen printing portion 7A and the second screen printing portion 7B are bypassed.

As shown in the sections of FIGS. 4(a) and 4(b), circuit board positioning portions 21 which position and hold the circuit boards 5 to the printing positions, respectively are disposed in the first screen printing portion 7A and second screen printing portion 7B which are symmetrically placed on the platform 2a of the printing apparatus 2(1) and the printing apparatus 2(2). Above the circuit board positioning portion 21, disposed are a mask plate 32 in which pattern holes are disposed, and a squeegee moving mechanism 37 which causes a squeegee 36 (a closed squeegee mechanism 36A or an opened squeegee mechanism 36B) constituting a squeegee unit 33, to slide over the mask plate 32 to which the paste is supplied. The mask plate 32, the squeegee unit 33, and the squeegee moving mechanism 37 constitute a screen printing mechanism which prints the paste on the circuit board 5.

Here, first mask plates 32(1) which are used for applying a printing operation on the bottom-surface printing areas 5e shown in FIG. 2 are attached to the first screen printing portion 7A and second screen printing portion 7B of the printing apparatus 2(1) which is positioned in the upstream side, and the closed squeegee mechanisms 36A are attached to the squeegee units 33 in correspondence with the first mask plates 32(1). Second mask plates 32(2) which are used for applying a printing operation on the upper-surface printing areas 5d shown in FIG. 2 are attached to the printing apparatus 2(2) which is positioned in the downstream side, and the opened squeegee mechanisms 36B are attached to the squeegee units 33 in correspondence with the second mask plates 32(2).

the above-described configuration, a printing lane A, i.e., the first screen printing portion 7A (the upstream screen printing portion) of the printing apparatus 2(1), first screen printing portion 7A (the downstream screen printing portion) of the printing apparatus 2(2), and distributing conveyor 42A (the circuit board transferring portion) of the circuit board distributing apparatus 4(2) which are enclosed by a dashed line box 20A corresponds to the screen printing apparatus set forth in claim 1. Similarly, also a printing lane B, i.e., the second screen printing portion 7B (the upstream screen printing portion) of the printing apparatus 2(1), second screen printing portion 7B (the downstream screen printing portion) of the printing apparatus 2(2), and distributing conveyor 42B (the circuit board transferring portion) of the circuit board distributing apparatus 4(2) which are enclosed by a dashed line box 20B corresponds to the screen printing apparatus set forth in claim 1. The two printing lanes can perform the printing operation while independently transporting the circuit boards 5.

Namely, the electronic component mounting line 1 shown in FIG. 1 has a form in which the upstream screen printing portion and the downstream screen printing portion are pairedly placed across the line center line CL of the electronic component mounting line 1, and the two printing lanes (printing lanes A, B) that individually perform the printing work by the upstream screen printing portion and the downstream screen printing portion while transporting the circuit boards 5 to the downstream are in the both sides of the line center line CL, respectively.

In the embodiment, the circuit board transporting portions 8A, 8B for transporting the circuit boards 5 on which the printing operation is to be performed, in the circuit board transportation direction (X-direction) are disposed midway between the printing lanes A, B, and allow the circuit boards 5 to be transported while bypassing as required the upstream screen printing portion and/or the downstream screen printing portion. Moreover, the circuit boards 5 can be distributed between the printing lane A and the printing lane B, by the circuit board distributing apparatus 4(2) disposed between the printing apparatus 2(1) and the printing apparatus 2(2). For example, the circuit board 5 which has been subjected to the printing work in the first screen printing portion 7A of the printing lane A can be transported into the second screen printing portion 7B of the printing lane B, and the printing work can be performed on the circuit board. On the contrary, the circuit board 5 which has been subjected to the printing work in the second screen printing portion 7B of the printing lane B can be transported into the first screen printing portion 7A of the printing lane A, and the printing work can be performed on the circuit board. In this case, namely, the circuit board distributing apparatus 4(2) functions as a circuit board distributing portion which is disposed midway between the upstream screen printing portion and the downstream screen printing portion, and which transfers the circuit board 5 between the two printing lanes A, B.

Next, the configurations of the circuit board positioning portion 21, the squeegee unit 33, and the squeegee moving mechanism 37 will be described in detail with reference to FIG. 5. Referring to FIG. 5, the circuit board positioning portion 21 is configured by stacking a Y-axis table 22, an X-axis table 23, and a θ-axis table 24, and combining a first Z-axis table 25 with a second Z-axis table 26 on the stack. The configuration of the first Z-axis table 25 will be described. On the side of the upper surface of a horizontal base plate 24a which is disposed on the upper surface of the θ-axis table 24, a base plate 25a which is similarly horizontal is liftably held by a lift guiding mechanism (not shown). The base plate 25a is raised and lowered by a Z-axis lifting mechanism having a configuration where a plurality of feeding screws 25c are rotated through a belt 25d by a circuit board moving Z-axis motor 25b. Two vertical frames 25e upstand from the base plate 25a, and the pair of circuit board transporting mechanisms 28 are held by upper end portions of the vertical frames 25e.

The circuit board transporting mechanisms 28 are disposed in parallel to the circuit board transporting direction (the X-direction—the direction perpendicular to the plane of the sheet in FIG. 5), and transport the circuit board 5 on which the printing operation is to be performed while both end portions of the circuit board are supported, by a conveyor mechanism disposed in the circuit board transporting mechanisms 28. When the first Z-axis table 25 is driven, the circuit board 5 in a state where it is held by the circuit board transporting mechanisms 28 can be raised or lowered together with the circuit board transporting mechanisms 28 with respect to the screen printing mechanism.

The configuration of the second Z-axis table 26 will be described. A horizontal base plate 26a is disposed midway between the circuit board transporting mechanisms 28 and the base plate 25a so as to be liftable along a lift guiding mechanism (not shown). The base plate 26a is raised and lowered by a Z-axis lifting mechanism having a configuration where a plurality of feeding screws 26c are rotated through a belt 26d by a lower receiving portion lifting motor 26b. A circuit board under receiving portion 27 is detachably attached to the upper surface of the base plate 26a. The circuit board under receiving portion 27 supports from the lower side and holds the circuit board 5 which is transported to the printing position in the screen printing mechanism.

In the printing operations by the first screen printing portion 7A and the second screen printing portion 7B, the circuit board transporting mechanisms 28 receive the circuit boards 5 which are supplied from the upstream apparatus, through the distributing conveyors 41A, 41B of the circuit board distributing apparatus 4(1), and transport and position the circuit boards to the printing positions in the screen printing mechanism. Then, the circuit boards 5 on which printing has been performed by the screen printing mechanism are transported from the printing positions by the circuit board transporting mechanisms 28, and transferred to the distributing conveyors 42A, 42B of the circuit board distributing apparatus 4(2).

When the second Z-axis table 26 is driven, the circuit board under receiving portion 27 is raised or lowered with respect to the circuit board 5 in a state where it is held by the circuit board transporting mechanisms 28. Then, an under supporting surface of the circuit board under receiving portion 27 butts against the lower surface of the circuit board 5, so that the circuit board under receiving portion 27 supports the circuit board 5 from the lower surface side. A clamping mechanism 29 is disposed on the upper surface of the circuit board transporting mechanisms 28. The clamping mechanism 29 includes two clamping members 29a which are placed so as to be laterally opposed to each other. When one of the clamping members 29a is advanced or retracted by a driving mechanism 29b, the circuit board 5 is clamped and fixed from the both sides.

Next, the structure of the screen printing mechanism which is disposed above the circuit board positioning portion 21, and which prints the paste on a circuit board transported to the printing position will be described. Referring to FIGS. 3 and 5, a mask plate 32 is stretched in a mask frame 31 which is held by a mask holder (not shown), and, in the mask plate 32, pattern holes 32c are disposed correspondingly with printing portion in the circuit board 5. Above the mask plate 32, the squeegee unit 33 is disposed so as to be movable by the squeegee moving mechanism 37.

The squeegee unit 33 includes the closed squeegee mechanism 36A (see FIG. 6) or the opened squeegee mechanism 36B (see FIG. 7), and is horizontally moved in the forward and reverse directions in the Y-direction by the squeegee moving mechanism 37 including a squeegee moving motor 37a. In FIG. 3, in the first screen printing portions 7A and the second screen printing portions 7B, illustrations of the mask plates 32, moving plates 34, squeegee moving mechanisms 37, and the like of the first screen printing portions 7A are omitted.

As shown in FIG. 3, a head X-axis table 40X which is moved in the Y-direction by a head Y-axis table 40Y is disposed above the circuit board positioning portion 21, and a camera head unit 38 and a mask cleaning unit 39 are attached to the head X-axis table 40X. The camera head unit 38 includes a circuit board recognition camera 38a for taking an image of the circuit board 5 from the upper side, and a mask recognition camera 38b for taking an image of the mask plate 32 from the side of the lower surface, and the mask cleaning unit 39 includes a cleaning head for cleaning the lower surface of the mask plate 32.

When the camera head unit 38 and the mask cleaning unit 39 are horizontally moved by driving the head X-axis table 40X and the head Y-axis table 40Y, recognition of the circuit board 5, and that of the mask plates 32 can be simultaneously performed, and the lower surface of the mask plates 32 can be cleaned as required. When these works are not performed, the camera head unit 38 and the mask cleaning unit 39 are in positions which are laterally retracted from the above of the circuit board positioning portion 21.

Figures 6A, 6B:
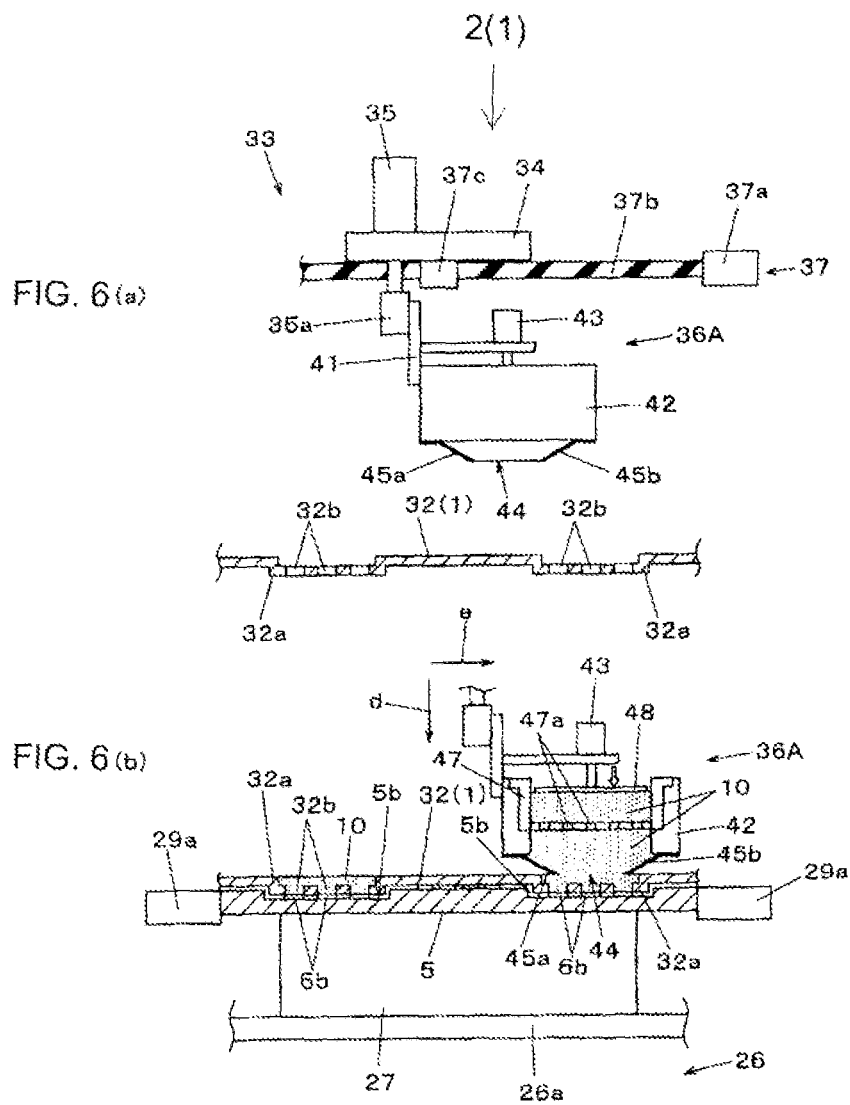
FIGS. 6(a) and 6(b) are diagrams of the structure and function of a closed squeegee mechanism which is used in the screen printing apparatus of the embodiment of the invention.

Referring to FIG. 6, next, the configuration of the squeegee unit 33 of the printing apparatus 2(1) which is the upstream screen printing portion, and the first mask plates 32(1) will be described. As shown in FIG. 6(a), a feeding screw 37b which is rotated by the squeegee moving motor 37a is screwed with a nut member 37c which is fixed to the lower surface of the moving plate 34. The closed squeegee mechanism 36A is attached through a coupling member 41 to a lifting member 35a which is raised and lowered by a squeegee lifting mechanism 35 that is vertically disposed on the upper surface of the moving plate 34.

The closed squeegee mechanism 36A includes a main unit portion 42 in which the cream solder is retained, and a pressurizing mechanism 43 which pressurizes the cream solder in the main unit portion 42. As shown in FIG. 6(b), the cream solder 10 in a state where it is housed in a replaceable cartridge 47 is supplied to the main unit portion 42. An extrusion hole 47a is disposed in the bottom surface of the cartridge 47. When a pressurizing plate 48 is pressed down by the pressurizing mechanism 43, the cream solder 10 in the cartridge 47 is pressurized and extruded through the extrusion hole 47a. Two sliding contact plates 45a, 45b which are sliding contacted with the mask plate 32 during printing are disposed on the side of the lower surface of the main unit portion 42, and the pressurized cream solder is downward supplied through a print opening 44 which is disposed between the sliding contact plates 45a, 45b.

FIG. 6(a) shows a section of the first mask plate 32(1) which is used while being combined with the closed squeegee mechanism 36A. As shown in the section, fitting portions 32a having a shape which is downward projected are disposed in the first mask plate 32(1). The fitting portions 32a are disposed in correspondence with the bottom-surface printing areas 5e of the circuit board 5 which is a printing object, and have a shape which can be fitted into the recesses 5b formed in the circuit board 5. In the fitting portions 32a, pattern holes 32b are formed in correspondence with the bottom-surface electrodes 6b which are printing objects. Namely, the first mask plate 32(1) which is a bottom-surface printing mask has a form having the fitting portions 32a which are disposed in correspondence with the bottom-surface printing areas 5e, and which are to be fitted into the recesses 5b, and the pattern holes 32b which are formed in the fitting portions 32a in correspondence with the bottom-surface electrodes 6b.

When the printing apparatus 2(1) performs the printing operation on the bottom-surface printing areas 5e shown in FIG. 2, in a state where, as shown in FIG. 6(b), the circuit board 5 is received from the side of the lower surface by the circuit board under receiving portion 27, and positioned so that the fitting portions 32a are to be fitted into the recesses 5b, the circuit board 5 is caused to butt from the lower side against the first mask plate 32(1). In this state, next, the squeegee lifting mechanism 35 is driven to lower the closed squeegee mechanism 36A (the arrow d), and the sliding contact plates 45a, 45b are caused to butt against the upper surface of the first mask plate 32(1).

In this state, while the cream solder 10 in the cartridge 47 is pressurized by the pressurizing mechanism 43, the closed squeegee mechanism 36A is slid in the printing direction by the squeegee moving mechanism 37 (the arrow e). Therefore, the cream solder 10 is pushed out into the recesses 5b from the print opening 44 formed between the sliding contact plates 45a, 45b, and further filled into the pattern holes 32b. Thereafter, a plate separating operation in which the circuit board 5 is lowered together with the circuit board under receiving portion 27 to separate from the lower surface of the first mask plate 32(1) is performed, whereby the cream solder 10 is printed on the bottom-surface electrodes 6b formed in the bottom-surface printing areas Se in the recesses 5b. Namely, the printing apparatus 2(1) includes the closed squeegee mechanism 36A which butts against and slides over the upper surface of the first mask plate 32(1) that is the bottom-surface printing mask, to pressurize the cream solder 10 retained inside, to supply the paste into the recesses 5b of the circuit board 5.

Referring to FIG. 7, next, the configuration of the squeegee unit 33 of the printing apparatus 2(2) which is the downstream screen printing portion, and the second mask plates 32(2) will be described. As shown in FIG. 7(a), the squeegee unit 33 includes the opened squeegee mechanism 36B to which a pair of squeegee members 49 are attached. The moving plate 34 is moved in the Y-direction by the squeegee moving mechanism 37 which is configured in a similar manner as the squeegee moving mechanism 37 shown in FIG. 6, and a pair of squeegee lifting mechanisms 35 are disposed on the upper surface of the moving plate 34. The squeegee members 49 are coupled to a lifting member 35a which is raised and lowered by the squeegee lifting mechanisms 35, through a squeegee holder 49a.

FIG. 7(a) shows a section of the second mask plate 32(2) which is used while being combined with the opened squeegee mechanism 36B. In the second mask plate 32(2), as shown in the section, the pattern holes 32c are formed in correspondence with upper-surface electrodes 6a on which are printing objects, and which are disposed on the upper-surface printing areas 5d which is a printing object. Namely, the second mask plate 32(2) which is an upper-surface printing mask has a form having the pattern holes 32c which are disposed in correspondence with the upper-surface printing areas 5d, and which are formed in correspondence with the upper-surface electrodes 6a.

When the printing apparatus 2(2) performs the printing operation on the upper-surface printing areas 5d shown in FIG. 2, in a state where, as shown in FIG. 7(b), the circuit board 5 is received from the side of the lower surface by the circuit board under receiving portion 27, and the pattern holes 32c are positioned to the upper-surface electrodes 6a, the circuit board 5 is caused to butt from the lower side against the second mask plate 32(2).

In this state, next, the squeegee lifting mechanism 35 is driven to lower the squeegee member 49 on which is a printing object in the opened squeegee mechanism 36B (the arrow f), and a lower end portion of the squeegee member 49 is caused to butt against the upper surface of the second mask plate 32(2) to which the cream solder 10 is previously supplied.

In this state, then, a squeegeeing operation in which the squeegee member 49 is slid in the printing direction by the squeegee moving mechanism 37 is performed (the arrow g). Therefore, the cream solder 10 is pushed by the squeegee member 49 into the pattern holes 32c, and filled thereinto. Thereafter, a plate separating operation in which the circuit board 5 is lowered together with the circuit board under receiving portion 27 to separate from the lower surface of the second mask plate 32(2) is performed, whereby the cream solder 10 is printed on the upper-surface electrodes 6a formed in the upper-surface printing areas 5d. Namely, the printing apparatus 2(2) includes the squeegee member 49 which butts against and slides over the upper surface of the second mask plate 32(2) that is the upper-surface printing mask, to fill the cream solder 10 into the pattern holes 32c.

In the embodiment, the example in which the opened squeegee mechanism 36B is used as a squeegee for filling the cream solder 10 the pattern holes 32c of the second mask plate 32(2) is shown. A printing surface on which the closed squeegee mechanism 36A can perform printing is not limited to the bottom surfaces 5c of the recesses 5b such as shown in FIG. 6. Therefore, the closed squeegee mechanisms 36A may be used as a squeegee for filling the cream solder 10 into the pattern holes 32c. Namely, "a squeegee which butts against and slides over an upper surface of the upper-surface printing mask to fill the paste into the pattern holes" set forth in claim 1 includes not only the opened squeegee mechanism 36B shown in FIG. 7, but also the closed squeegee mechanisms 36A FIG. 6.

Next, the printing and circuit board transporting operations which are performed by the printing apparatus 2(1) and the printing apparatus 2(2) will be described with reference to FIGS. 8, 9, and 10. First, the screen printing method which is performed on the circuit board 5 shown in FIG. 2, and in which the paste for bonding an electronic component is sequentially printed in two steps by the printing apparatus 2(1) and the printing apparatus 2(2) will be described with reference to FIG. 8.

As shown in FIG. 8(a), first, the substrates 5A, 5B are delivered respectively from the upstream apparatus to the distributing conveyors 41A, 41B of the circuit board distributing apparatus 4(1), and then transferred from the distributing conveyors 41A, 41B to the first screen printing portion 7A and second screen printing portion 7B of the corresponding printing apparatus 2(1) which is the upstream screen printing portion. In the substrates 5A, 5B, as shown in FIG. 2, the upper-surface printing areas in which the upper-surface electrodes are formed, and the bottom-surface printing areas which are set on the bottom surfaces of the recesses, and in which the bottom-surface electrodes are formed are set as a printing objects. The substrates may be of the same kind or of different kinds.

As shown in FIG. 8(b), in the substrates 5A, 5B which are delivered to the first screen printing portion 7A and second screen printing portion 7B of the printing apparatus 2(1), next, a bottom-surface printing step which is aimed to the bottom-surface printing areas 5e where the bottom-surface electrodes 6b are formed is performed. As shown in FIG. 6, namely, the substrates 5A, 5B are positioned to the first mask plates 32(1) which are the bottom-surface printing masks having: the fitting portions 32a that are disposed in correspondence with the bottom-surface printing areas 5e, and that are to be fitted into the recesses 5b; and the pattern holes 32b that are formed in the fitting portions 32a in correspondence with the bottom-surface electrodes 6b, and the closed squeegee mechanisms 36A are caused to butt against and slide over the upper surfaces of the first mask plates 32(1), whereby the cream solder 10 retained in the closed squeegee mechanisms 36A is pressurized and supplied into the recesses 5b of the substrates 5A, 5B. As a result, the cream solder 10 is printed on the bottom-surface electrodes 6b through the pattern holes 32b.

As shown in FIG. 8(c), thereafter, the substrates 5A, 5B in which the bottom-surface printing step has been completed are delivered to the first screen printing portion 7A and second screen printing portion 7B of the corresponding printing apparatus 2(2) which is the downstream screen printing portion, through the distributing conveyors 42A, 42B of the circuit board distributing apparatus 4(2), respectively. In the portions, then, an upper-surface printing step which is aimed to the upper-surface printing areas 5d where the upper-surface electrodes 6a are formed is performed in the substrates 5A, 5B. As shown in FIG. 7, namely, the substrates 5A, 5B are positioned to the second mask plates 32(2) having the pattern holes 32c which are disposed in correspondence with the upper-surface printing areas 5d, and which are formed in correspondence with the upper-surface electrodes 6a, and the squeegee members 49 are caused to butt against and slide over the upper surfaces of the second mask plates 32(2), whereby the cream solder 10 is filled into the pattern holes 32c. As a result, the cream solder 10 is printed on the upper-surface electrodes 6a through the pattern holes 32c. In parallel to the upper-surface printing step, the substrates 5A, 5B are delivered respectively from the upstream apparatus to the distributing conveyors 41A, 41B of the circuit board distributing apparatus 4(1), and further transferred to the first screen printing portion 7A and second screen printing portion 7B of the corresponding printing apparatus 2(1).

As shown in FIG. 8(d), in the printing apparatus 2(1), next, the bottom-surface printing step is performed on the newly delivered substrates 5A, 5B. In the printing apparatus 2(2), then, the substrates 5A, 5B in which the upper-surface printing step has been completed are delivered to the distributing conveyors 43A, 43B of the circuit board distributing apparatus 4(3). In the printing apparatus 2(1) and the printing apparatus 2(2), thereafter, bottom-surface printing and upper-surface printing steps which are similar to those as described above are repeatedly performed. Namely, the above-described screen printing method has a mode in which the upstream screen printing portion and the downstream screen printing portion form a pair (the first screen printing portion 7A and the second screen printing portion 7B) which is placed across the line center line CL of the electronic component mounting line 1, and the printing works are individually performed while the substrates 5A, 5B are downwardly transported on the both side of the line center line CL, respectively.

As described above, in the screen printing apparatus and screen printing method which are shown in the embodiment, in printing of the cream solder 10 which is a paste for bonding an electronic component, on the upper-surface printing areas 5d which are set on the upper face 5a of the circuit board 5, and in which the upper-surface electrodes 6a are formed, and the bottom-surface printing areas 5e which are set on the bottom surfaces 5c of the recesses 5b, and in which the bottom-surface electrodes 6b are formed, the printing apparatus 2(1) which is the upstream screen printing portion, and the printing apparatus 2(2) which is the downstream screen printing portion are placed in series, and the cream solder 10 is sequentially printed in two steps on the circuit board 5.

Then, the configuration is employed where the printing apparatus 2(1) includes: the first mask plate 32(1) which is the bottom-surface printing mask disposed in correspondence with the bottom-surface printing areas 5e; and the closed squeegee mechanism 36A which butts against and slides over the upper surface of the first mask plate 32(1) to pressurize and supply the cream solder 10, and the printing apparatus 2(2) includes: the second mask plates 32(2) which is the upper-surface printing mask disposed in correspondence with the upper-surface printing areas 5d; and the squeegee member 49 which butts against and slides over the upper surface of the second mask plate 32(2) to fill the cream solder 10 into the pattern holes 32c. According to the configuration, in the case where the upper face 5a of the circuit board 5, and bottom surfaces 5c of the recesses 5b disposed in the circuit board 5 in which the conditions for excellent filling of the cream solder 10 are inherently different from each other are set as printing object surfaces, it is possible to ensure an excellent printing quality.

In the embodiment, moreover, the configuration is employed where the printing apparatus 2(1) and printing apparatus 2(2) each of which has an independent screen printing portion individually set on the upper face 5a of the circuit board 5, and the bottom surfaces 5c of the recesses a disposed in the circuit board 5, as a printing object. Therefore, mask cleaning that is said to be necessary in a process in which screen printing is repeatedly conducted can be performed with excellent quality. In mask cleaning, in order to wipe off printing residue on the lower surface of a mask plate, a cleaning sheet must be sliding contacted with the lower surface of the mask plate. In the case where the upper face 5a of the circuit board 5, and the bottom surfaces 5c of the recesses 5b disposed in the circuit board 5 are set as printing object by the same mask plate, a cleaning sheet cannot be adequately sliding contacted with a surface to be cleaned because the lower surfaces of fitting portions corresponding to the recesses 5b, and a usual planar portion are not in the same plane. In the embodiment, by contrast, the upper face 5a of the circuit board 5 is set as a printing object independently from the bottom surfaces 5c of the recesses 5b disposed in the circuit board 5, and hence a cleaning sheet can be satisfactorily sliding contacted with the lower face of a mask sheet.

In the embodiment, the example in which, as in the circuit board 5 shown in FIG. 2, the upper face 5a, and the bottom surfaces 5c of the recesses a opening in the upper face 5a are set as a printing object has been described. It is a matter of course that, also in the case where only one of the upper face 5a, and the bottom surfaces 5c of the recesses 5b opening in the upper face 5a is set as a printing object, a screen printing apparatus having a configuration in which the printing apparatus 2(1) and the printing apparatus 2(2) are connected to each other can be used.

In the case where only the bottom surfaces 5c of the recesses 5b are set as a printing object, for example, only the printing apparatus 2(1) may be used in an actual printing work, and, as shown in FIG. 9, and the first screen printing portion 7A and second screen printing portion 7B of the printing apparatus 2(2) may be bypassed in the transportation of the circuit board 5. As shown in FIG. 9(a), namely, the substrates 5A, 5B which are delivered respectively from the upstream apparatus to the distributing conveyors 41A, 41B of the circuit board distributing apparatus 4(1) are transferred from the distributing conveyors 41A, 41B to the first screen printing portion 7A and second screen printing portion 7B of the printing apparatus 2(1) which is the upstream screen printing portion.

As shown in FIG. 9(b), in the substrates 5A, 5B which are delivered to the first screen printing portion 7A and second screen printing portion 7B of the corresponding printing apparatus 2(1), next, a bottom-surface printing step which is aimed to the bottom-surface printing areas 5e where the bottom-surface electrodes 6b are formed is performed in a similar manner as FIG. 8(b). As shown in FIG. 9(c), thereafter, the substrates 5A, 5B in which the bottom-surface printing step has been completed are delivered to the circuit board transporting portions 8A, 8B of the printing apparatus 2(2) through the distributing conveyors 42A, 42B of the circuit board distributing apparatus 4(2), respectively. As shown in FIG. 9(d), next, the circuit boards are transferred to the distributing conveyors 43A, 43B of the circuit board distributing apparatus 4(3) while being caused to bypass the first screen printing portion 7A and the second screen printing portion 7B by the circuit board transporting portions 8A, 8B, and further transferred to the downstream apparatus.

In the case where only the upper face 5a of the circuit board 5 is set as a printing object, only the printing apparatus 2(2) may be used in an actual printing work, and, as shown in FIG. 10, and the first screen printing portion 7A and second screen printing portion 7B of the printing apparatus 2(1) may be bypassed in the transportation of the circuit board 5. As shown in FIG. 10(a), next, the substrates 5A, 5B which are delivered respectively from the upstream apparatus to the distributing conveyors 41A, 41B of the circuit board distributing apparatus 4(1) are transferred from the distributing conveyors 41A, 41B to the circuit board transporting portions 8A, 8B of the printing apparatus 2(1). As shown in FIG. 10(b), next, the circuit boards 5A, 5B are transferred to the distributing conveyors 42A, 42B of the circuit board distributing apparatus 4(2) while being caused to bypass the first screen printing portion 7A and second screen printing portion 7B of the printing apparatus 2(1) by the circuit board transporting portions 8A, 8B. Thereafter, the distributing conveyors 42A, 42B are moved to the positions connected to the first screen printing portion 7A and second screen printing portion 7B of the printing apparatus 2(2), and the circuit boards 5A, 5B are delivered to the first screen printing portion 7A and second screen printing portion 7B of the printing apparatus 2(2) as shown FIG. 10(c).

In the substrates 5A, 5B which are delivered to the first screen printing portion 7A and second screen printing portion 7B of the printing apparatus 2(2), next, an upper-surface printing step which is aimed to the upper-surface printing areas where the upper-surface electrodes are formed is performed in a similar manner as FIG. 8(c). As shown in FIG. 10(d), thereafter, the substrates 5A, 5B in which the bottom-surface printing step has been completed are transferred to the distributing conveyors 43A, 43B of the circuit board distributing apparatus 4(3), respectively, and further transferred to the downstream apparatus.

The application is based on Japanese Patent Application (No. 2009-105980) filed Apr. 24, 2009, and its disclosure is incorporated herein by reference.

INDUSTRIAL APPLICABILITY

The screen printing apparatus and screen printing method have an effect that, in screen printing that is to be performed on the upper surface of a circuit board, and the bottom surfaces of recesses opening in the upper surface, a printing work can be effectively performed while ensuring an excellent printing quality, and are useful in the field of electronic component mounting in which a mounting circuit board is produced by mounting electronic components on a circuit board.

DESCRIPTION OF REFERENCE NUMERALS AND SIGNS 1 electronic component mounting line
2 printing apparatus (screen printing apparatus)
3 mounting apparatus (electronic component mounting apparatus)
4 circuit board distributing apparatus
5, 5A, 5B circuit board
5a upper surface
5b a recess
5c bottom surface
5e bottom-surface printing area
6a upper-surface electrode
6b bottom-surface electrode
7A first screen printing portion
7B second screen printing portion
8A, 8B circuit board transporting portion
9b, 12A, 12B circuit board transporting mechanism
21 circuit board positioning portion
32 mask plate
32(1) first mask plate (bottom-surface printing mask)
32(2) second mask plate (upper-surface printing mask)
33 squeegee unit
36A closed squeegee mechanism
36B opened squeegee mechanism
37 squeegee moving mechanism

The invention claimed is:

1. A screen printing apparatus which is to be connected to an upstream side of an electronic component mounting apparatus for mounting an electronic component onto a circuit board, to constitute an electronic component mounting line, and which prints a paste for bonding an electronic component on upper-surface printing areas which are set on an upper face of the circuit board, and in which upper-surface electrodes are formed, and bottom-surface printing areas which are set on bottom surfaces of recesses opening in the upper surface, and in which bottom-surface electrodes are formed, the screen printing apparatus comprising: an upstream screen printing portion and downstream screen printing portion which are placed in series along a circuit board transporting direction in the electronic component mounting line, and which sequentially print the paste in two steps on the circuit board; and a circuit board transferring portion which transfers the circuit board from the upstream screen printing portion to the downstream screen printing portion, wherein the upstream screen printing portion includes: a bottom-surface printing mask having fitting portions which are disposed in correspondence with the bottom-surface printing areas, and which are to be fitted into the recesses, and pattern holes which are formed in the fitting portions in correspondence with the bottom-surface electrodes; and a closed squeegee mechanism abutting against and sliding over an upper surface of the bottom-surface printing mask to pressurize the paste that is retained inside, to supply the paste into the fitting portions, and wherein the downstream screen printing portion includes: an upper-surface printing mask having pattern holes which are disposed in correspondence with the upper-surface printing areas, and which are formed in correspondence with the upper-surface electrodes; and a squeegee abutting against and sliding over an upper surface of the upper-surface printing mask to fill the paste into the pattern holes.

2. A screen printing apparatus according to claim 1, wherein a pair of the upstream screen printing portions and a pair of the downstream screen printing portions are placed across a line center line of the electronic component mounting line to constitute two printing lanes in each of which a printing work is individually performed by the upstream screen printing portion and the downstream screen printing portion while downwardly transporting the circuit board, on both sides of the line center line.

3. A screen printing apparatus according to claim 2, wherein the screen printing apparatus includes a circuit board distributing portion which is disposed midway between the upstream screen printing portion and the downstream screen printing portion, and which transfers the circuit board between the two printing lanes.

4. A screen printing apparatus according to claim 2, wherein circuit board transporting portions which transport the circuit board in the circuit board transporting direction are disposed midway between the two printing lanes, and the circuit board is enabled to be transported by the circuit board transporting portions while bypassing the upstream screen printing portion and/or the downstream screen printing portion.

5. A screen printing method in which, on upper-surface printing areas which are set on an upper face of a circuit board, and in which upper-surface electrodes are formed, and bottom-surface printing areas which are set on bottom surfaces of recesses opening in the upper surface, and in which bottom-surface electrodes are formed, the screen printing method comprising:

sequentially printing a paste for bonding an electronic component in two steps by an upstream screen printing portion and downstream screen printing portion which are placed in series along a circuit board transporting direction in an electronic component mounting line, wherein, in a bottom-surface printing step which is aimed to the bottom-surface printing areas, and which is performed by the upstream screen printing portion, positioning the circuit board to a bottom-surface printing mask having fitting portions which are disposed in correspondence with the bottom-surface printing areas, and which are to be fitted into the recesses, and pattern holes which are formed in the fitting portions in correspondence with the bottom-surface electrodes, and causing a closed squeegee mechanism to butt against and slide over an upper surface of the bottom-surface printing mask, whereby pressurizing and supplying the paste that is retained inside the closed squeegee into the fitting portions, and, in an upper-surface printing step which is aimed to the upper-surface printing areas, and which is performed by the downstream screen printing portion, positioning the circuit board to an upper-surface printing mask having pattern holes which are disposed in correspondence with the upper-surface printing areas, and which are formed in correspondence with the upper-surface electrodes, causing a squeegee to butt against and slide over an upper surface of the upper-surface printing mask, whereby filling the paste into the pattern holes.

6. A screen printing method according to claim 5, the method further comprising placing a pair of the upstream screen printing portions and a pair of the downstream screen printing portions across a line center line of the electronic component mounting line, and individually performing a printing work on both sides of the line center line while downwardly transporting the circuit board.

* * * * *